(12) United States Patent
Huang et al.

(10) Patent No.: US 9,264,569 B2
(45) Date of Patent: Feb. 16, 2016

(54) OPTICAL SCANNER INTEGRATED WITH SUBSTRATE METHOD OF MAKING AND METHOD OF USING THE SAME

(71) Applicant: TAIWAN SEMICONDUCTOR MANUFACTURING COMPANY, LTD., Hsinchu (TW)

(72) Inventors: Tien-Yu Huang, Shuishang Township (TW); Ying-Hao Kuo, Hsinchu (TW); Kuo-Chung Yee, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/089,812

(22) Filed: Nov. 26, 2013

(65) Prior Publication Data

US 2015/0146268 A1    May 28, 2015

(51) Int. Cl.
*H04N 1/04* (2006.01)
*H04N 1/028* (2006.01)
*H04N 1/10* (2006.01)

(52) U.S. Cl.
CPC ............. *H04N 1/02815* (2013.01); *H04N 1/10* (2013.01); *H04N 2201/0422* (2013.01)

(58) Field of Classification Search
CPC ................... H04N 2201/0422; H04N 1/02815
USPC .......... 358/480, 474, 471, 475; 250/234–236; 372/20, 50.11
See application file for complete search history.

(56) References Cited

U.S. PATENT DOCUMENTS

| 5,953,294 | A | * | 9/1999 | Choi | 369/44.12 |
| 2003/0112838 | A1 | * | 6/2003 | Oh et al. | 372/20 |
| 2003/0123495 | A1 | * | 7/2003 | Cox | 372/20 |
| 2004/0004746 | A1 | * | 1/2004 | Riza | 359/204 |
| 2006/0203859 | A1 | * | 9/2006 | Cable et al. | 372/20 |

* cited by examiner

*Primary Examiner* — Cheukfan Lee
(74) *Attorney, Agent, or Firm* — Slater & Matsil, L.L.P.

(57) ABSTRACT

An optical scanner includes a substrate, and a tunable laser on the substrate, wherein the tunable laser is configured to emit light, and to sweep a wavelength of the emitted light through a waveband. The optical scanner further includes a grating over a top surface of the substrate, the grating configured to diffract light emitted from the tunable laser, and an angled reflective surface configured to reflect the diffracted light from the grating. The optical scanner further includes a refractive element configured to receive the reflected light from the angled reflective surface. The refractive element is configured to focus the reflected light in a first direction and to diverge the reflected light in a second direction perpendicular to the first direction.

20 Claims, 4 Drawing Sheets

OPTICAL SCANNER INTEGRATED WITH SUBSTRATE METHOD OF MAKING AND METHOD OF USING THE SAME

BACKGROUND

Optical scanners are used to capture images of objects, such as documents, three-dimensional articles, pictures, etc. Optical scanners emit light which is directed toward an object, the object reflects the incident light and the reflected light is detected by a light detecting device in order to capture an image of the portion of the object on which the light is incident. The incident light is moved across a surface of the object in order to capture an image of a greater portion of the object.

In some instances, the optical scanner includes a light source which emits light which is incident on a rotating polygonal mirror. A direction of light reflected by the rotating polygonal mirror changes as the polygonal mirror rotates to move the light across the surface of the object. In some instances, the rotating polygonal mirror is replaced with one or more pivoting planar mirrors. A single pivoting planar mirror operates in a similar manner as the rotating polygonal mirror. Optical scanners which include more than one pivoting planar mirrors include planar mirrors which pivot about different axes to facilitate two-dimensional control of the reflected light.

In some instances, an optical scanner includes a reflective micro-electrical mechanical system (MEMS) device which controls a direction of reflection of the incident light. The reflective MEMS is capable of two-dimensional scanning and of controlling an amount of light reflected in each direction based on movement of individual components of the reflective MEMS.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
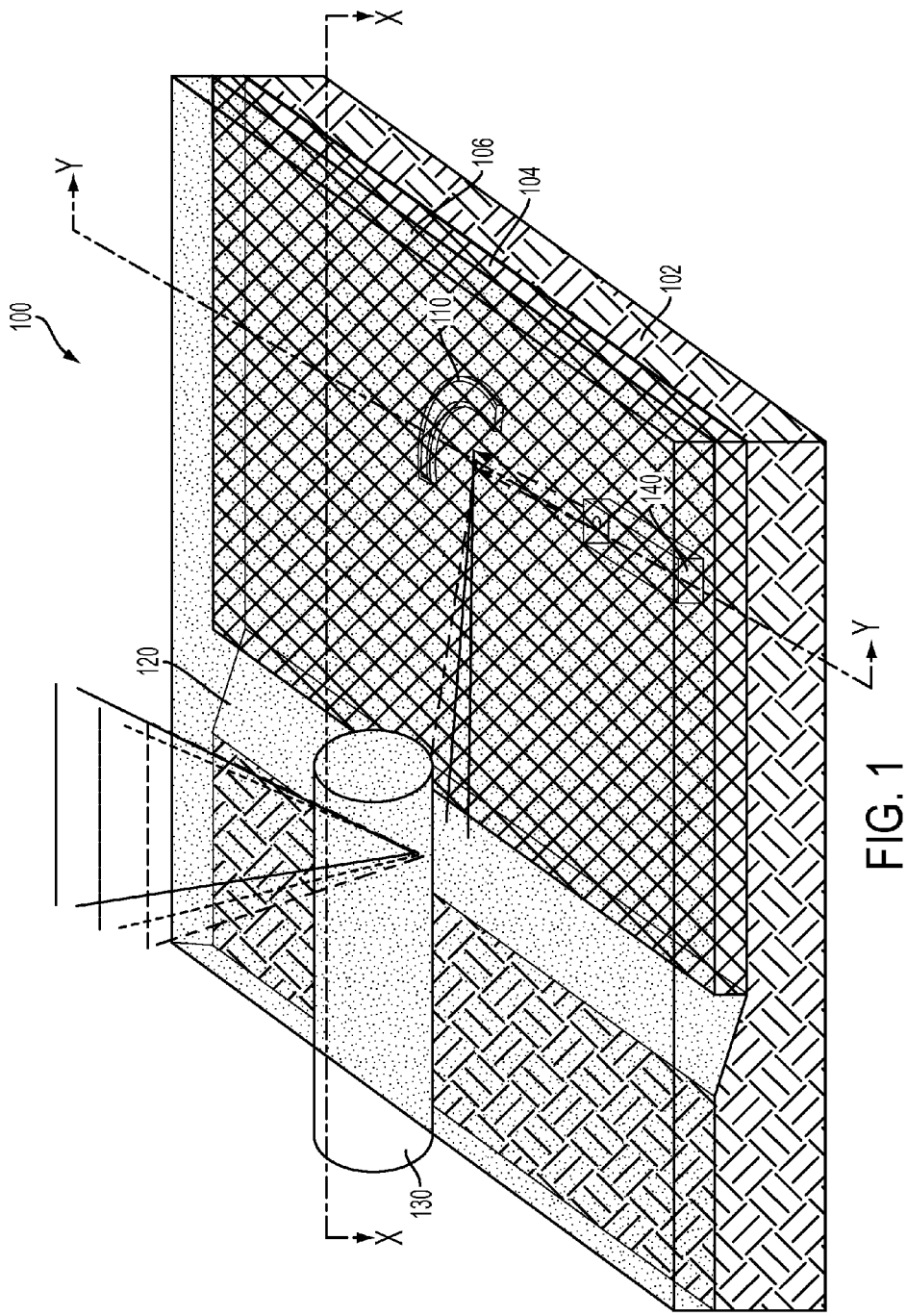
FIG. 1 is a perspective view of an optical scanner in accordance with one or more embodiments.

FIG. 1 is a perspective view of an optical scanner 100 in accordance with one or more embodiments. Optical scanner 100 includes a substrate 102. A core 104 is over a top surface of substrate 102. Core 104 is configured to allow light to propagate between various elements of optical scanner 100. A top cladding 106 is over core 104. Top cladding 104 helps to contain light within core 104. A grating 110 capable of diffracting incident light is positioned within core 104. A direction of the diffracted light is determined by a wavelength of the light incident on grating 110. An angled reflective surface 120 is positioned to receive light diffracted by grating 110. Angled reflective surface 120 is positioned to reflect light out of core 104 in a direction perpendicular to the top surface of substrate 102. A refractive element 130 is fixed above top cladding 106. Refractive element 130 is positioned to receive light reflected by angled reflective surface 120. Refractive element 130 focuses light in a first direction and diverges light in a second direction perpendicular to the first direction. A tunable laser 140 is positioned over substrate 102 and is positioned to emit light which will be incident on grating 110. Tunable laser 140 is capable of changing a wavelength of the emitted light.

Substrate 102 is used to support the elements of optical scanner 100 on a single optical bench. In some embodiments, substrate 102 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, substrate 102 has a semiconductor on insulator structure, such as a silicon on insulator (SOI) structure. In some embodiments, substrate 102 includes a doped epi layer or a buried layer. In some embodiments, substrate 102 has a multilayer structure, or the substrate includes a multilayer compound semiconductor structure.

Core 104 is configured to allow light to propagate to various elements of optical scanner 100. In some embodiments, core 104 is called a waveguide or a waveguide core. Core 104 is transparent to light emitted by tunable laser 140. In some embodiments, at least 85% of the light emitted by tunable laser 140 is transmitted through core 104. In some embodiments, at least 95% of the light emitted by tunable laser 140 is transmitted through core 104. A material of core 104 is selected based on a bandwidth of light emittable from tunable laser 140. In some embodiments, core 104 includes polysilicon, a high-k dielectric material, or another suitable material. A high-k dielectric material has a dielectric constant greater than silicon dioxide. In some embodiments, the high-k dielectric material includes silicon nitride (SiN), aluminum oxide ($Al_2O_3$), hafnium dioxide ($HfO_2$), or other suitable high-k dielectric materials. A thickness of core 104 is sufficient to allow light to propagate therethrough without unacceptable levels of interference. In some embodiments, the thickness of core 104 ranges from about 1 micron ($\mu m$) to about 20 $\mu m$. If the thickness of core 104 is too great, a size of optical scanner 100 becomes too large to fit within certain types of devices, in some instances.

Top cladding 106 is configured to prevent or minimize light from unintentionally escaping from core 104 during operation. A refractive index of top cladding 106, measured at the emittable bandwidth of tunable laser 140, is lower than a refractive index of core 104. In some embodiments, a difference in the refractive index of top cladding 106 and the refractive index of core 104 ranges from about 0.05 to 1.0. If the difference is too great, light directed from angled reflective surface 120 to refractive element 130 will experience a higher amount of reflection at an interface of top cladding 106 and core 104. The higher amount of reflection will decrease an amount of light output by optical scanner 100 used to scan an object. If the difference is too small, an increased amount of light propagating within core 104 will escape through top cladding 106 as the light reflects off the interface between the top cladding and the core. The increased amount of escaping light will reduce the amount of light output by optical scanner 100. In some embodiments, top cladding 106 includes silicon oxynitride (SiON), silicon dioxide ($SiO_2$), or another suitable material.

A thickness of top cladding 106 is sufficient to help prevent or minimize light from unintentionally escaping from core 104. In some embodiments, the thickness of top cladding 106 ranges from about 0.2 µm to about 10 µm. If the thickness of top cladding 106 is too thin, an amount of light unintentionally escaping core 104 will be too great, in some instances. If the thickness of top cladding 106 is too great, a size of optical scanner 100 will needlessly increase.

Grating 110 is positioned within core 104 to receive light from tunable laser 140. Grating 110 diffracts the received light. An angle of diffraction is determined by a pitch of grating 110, an angle of incidence of the incident light and a wavelength, or spectra, of the incident light. Grating 110 includes reflective elements formed within core 104. A distance between the reflective elements defines a pitch of grating 110. In some embodiments, the pitch of grating 110 is constant. As a wavelength of the light emitted by tunable laser 140 changes, the angle of diffraction for light exiting grating 100 also changes. In some embodiments, grating 110 is a concave grating. The concave grating helps to control a location where the diffracted light contacts angle reflective surface 120.

In some embodiments, the reflective elements of grating include aluminum (Al), titanium (Ti), tungsten (W), cobalt (Co), copper (Cu), gold (Au), silver (Ag), or other suitable reflective elements. In some embodiments, the pitch of grating 110 ranges from about 80 nanometers (nm) to about 5,000 nm. The pitch of grating 110 is selected based on a wavelength spectrum emitted from tunable laser 140. Sidewalls of the reflective elements are substantially perpendicular to the top surface of substrate 102. In some embodiments, an angle between sidewalls of the reflective elements and the top surface of substrate 102 ranges from about 85-degrees to about 95-degrees. The substantially perpendicular sidewalls of the reflective elements help to provide efficient diffraction and control over the angle of diffraction of grating 110.

Angled reflective surface 120 is configured to receive light diffracted by grating 110 and reflect the light through top cladding 106 to refractive element 130. In some embodiments, angled reflective surface 120 is within core 104. In some embodiments, angled reflective surface is directly on substrate 102. Angled reflective surface 120 is oriented at an angle with respect to the top surface of substrate 102. In some embodiments, the angle between angled reflective surface 120 and the top surface of substrate 102 ranges from about 35-degrees to about 60-degrees. In some embodiments, the angle between angled reflective surface 120 and the top surface of substrate 102 is about 45-degrees. In some embodiments, angled reflective surface 120 is formed by a reflective coating over substrate 102. In some embodiments, the reflective coating includes Al, Ti, W, Co, Cu, Au, Ag, or one or more other suitable reflective materials. In some embodiments, the reflective coating of angled reflective surface 120 is a same material as the reflective elements of grating 110. In some embodiments, the reflective coating of angled reflective surface 120 is a different material from the reflective elements of grating 110.

Refractive element 130 is configured to receive light reflected by angled reflective surface 120. Refractive element 130 focuses the received light in a first direction and diverges the received light in a second direction perpendicular to the first direction. For example, refractive element 130 focuses light in the first direction parallel to line Y-Y in FIG. 1; and diverges light in the second direction parallel to line X-X. As a result, line exiting refractive element 130 forms a line. In some embodiments, refractive element 130 is a cylindrical lens. In some embodiments, refractive element 130 includes an elliptical lens, a microlens array, or another suitable refractive element.

Refractive element 130 is fixed in place using an optical adhesive which is transparent to the wavelengths emitted by tunable laser 140. In some embodiments, at least 85% of the light emitted by tunable laser 140 is transmitted through refractive element 130. In some embodiments, at least 95% of the light emitted by tunable laser 140 is transmitted through refractive element 130. In some embodiments, refractive element 130 is adhered directly to top cladding 106. In some embodiments, an intermediate layer is positioned between refractive element 130 and top cladding 106, and the refractive element is adhered to the intermediate layer. In some embodiments, the intermediate layer helps to reduce reflections at an interface of the optical adhesive and top cladding 106.

Tunable laser 140 is positioned to emit light which is incident on grating 110. Tunable laser 140 is on substrate 102 in optical alignment with grating 110. By using a common substrate, e.g., substrate 102, to support both tunable laser 140 and grating 110, a durability of optical scanner 100 is increasable in comparison with devices which include a light source and a grating on different substrates. Sharing substrate 102 also helps to reduce a size of optical scanner 100 in comparison with devices which use separate substrate.

A wavelength of light emitted by tunable laser 140 is adjustable. In some embodiments, tunable laser 140 is an excimer laser, a $CO_2$ laser, a dye laser, a transition metal or lanthanide solid state laser, a laser diode, a free electron laser, or another suitable tunable laser. In some embodiments, a width of a waveband of the light emitting by tunable laser 140 ranges from about 40 nm to about 75 nm. In some embodiments, the width of the waveband is about 50 nm. In some embodiments, a center wavelength of tunable laser 140 ranges from about 400 nm to about 2,000 nm. A sweeping frequency of tunable laser 140 ranges from about 100 kilohertz (kHz) to about 100 megahertz (MHz).

In some embodiments, tunable laser 140 is not enclosed in core 104. In some embodiments, a height of tunable laser 140 is greater than the thickness of core 104. In some embodiments, tunable laser 140 is disposed completely outside core 104 and optically aligned with grating 110.

In operation, tunable laser 140 emits a first wavelength of light. The light propagates through core 104 and contacts grating 110. Grating 110 diffracts the light in a direction toward angle reflective surface 120. Angled reflective surface 102 reflects the light out of core 104 and top cladding 106 to refractive element 130. Refractive element 130 focuses the light to form a line. Tunable laser 140 sweeps through a waveband of light. As the wavelength of light changes, the angle of diffraction of grating 110 changes. The change in the angle of diffraction causes the light to contact angled reflective surface 120 at different locations which in turn changes a location of the line formed by refractive element 130. In effect, the line formed by refractive element 130 is scanned across a spatial range which is defined based on the waveband of tunable laser 140.

By integrating components of optical scanner 100 on a single optical bench, an overall size of the optical scanner is reduced with respect to other devices which include multiple optical benches. The smaller size of optical scanner 100 enables the optical scanner to be included in a variety of devices. In some embodiments, optical scanner 100 is part of a hand-held device such as a cell phone, a hand-held scanner or other suitable device. In some embodiments, optical scanner 100 is part of a medical device or a gaming device.

In addition, the sweeping frequency of tunable laser 140 is faster than mechanical methods of scanning such as a rotating polygonal mirror, a pivoting planar mirror or a reflective MEMS. The faster sweeping achievable by tunable laser 140 enables more rapid scanning of objects in comparison with the mechanical methods of scanning.

Figure 2A:
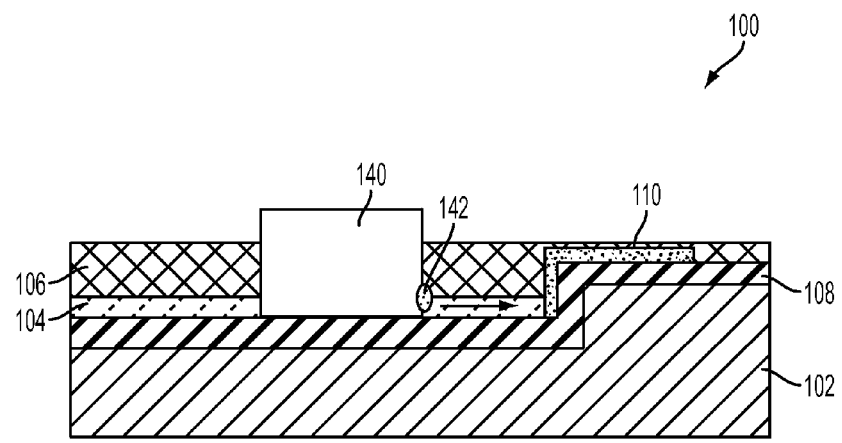
FIG. 2A is a cross-sectional view of an optical scanner in accordance with one or more embodiments.

FIG. 2A is a cross-sectional view of optical scanner 100 in accordance with one or more embodiments. FIG. 2A is a cross-sectional view along line Y-Y of FIG. 1. Optical scanner 100 further includes a bottom cladding 108 which is not shown in FIG. 1. Bottom cladding 108 is positioned between core 104 and substrate 102. Bottom cladding 108 is positioned between grating 110 and substrate 102 and between a portion of top cladding 106 and the substrate. Bottom cladding 108 is used to prevent or minimize light from unintentionally escaping from core 104 into substrate 102. A refractive index of bottom cladding 108 is lower than the refractive index of core 104. In some embodiments, a difference in the refractive index of bottom cladding 108 and the refractive index of core 104 ranges from about 0.05 to 1.0. In some embodiments, bottom cladding 108 includes SiON, $SiO_2$, or another suitable material. In some embodiments, bottom cladding 108 includes a same material as top cladding 106. In some embodiments, bottom cladding 108 includes a different material from top cladding 106.

A thickness of bottom cladding 108 is sufficient to help prevent light from unintentionally escaping from core 104. In some embodiments, the thickness of bottom cladding 108 ranges from about 0.2 μm to about 10 μm. In some embodiments, bottom cladding 108 has a same thickness as top cladding 106. In some embodiments, bottom cladding 108 has a different thickness from top cladding 106.

FIG. 2A includes tunable laser 140 extending from bottom cladding 108 through core 104 and out of top cladding 106. An output 142 of tunable laser 140 is configured to emit light into core 104. The light is incident on grating 110. In some embodiments, tunable laser 140 is disposed completely outside core 104 and output 142 is aligned within a cone of acceptable of the core to allow light from the tunable laser to enter the core.

Figure 2B:
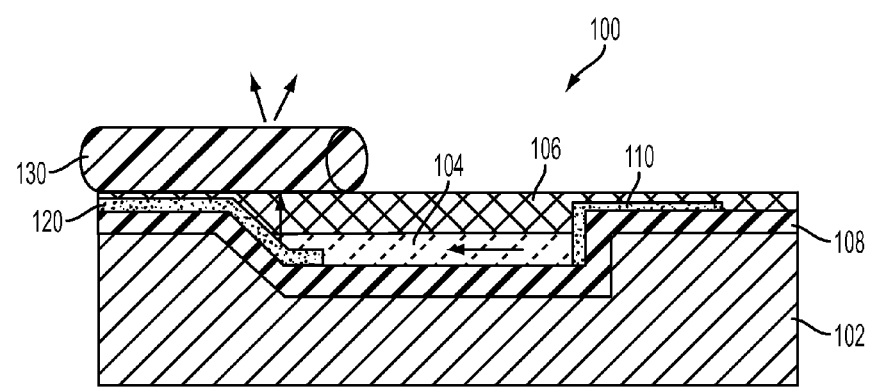
FIG. 2B is a cross-sectional view of an optical scanner in accordance with one or more embodiments.

FIG. 2B is a cross-sectional view of optical scanner 100 in accordance with one or more embodiments. FIG. 2B is a cross-sectional view along line X-X of FIG. 1. Bottom cladding 108 is positioned between angled reflective surface 120 and substrate 102. Light diffracted by grating 110 propagates through core 104 to angled reflective surface 120. Angled reflective surface 120 reflects the light upward through top cladding 106 to refractive element 130. Refractive element 130 focuses the light into a line.

Figure 3:
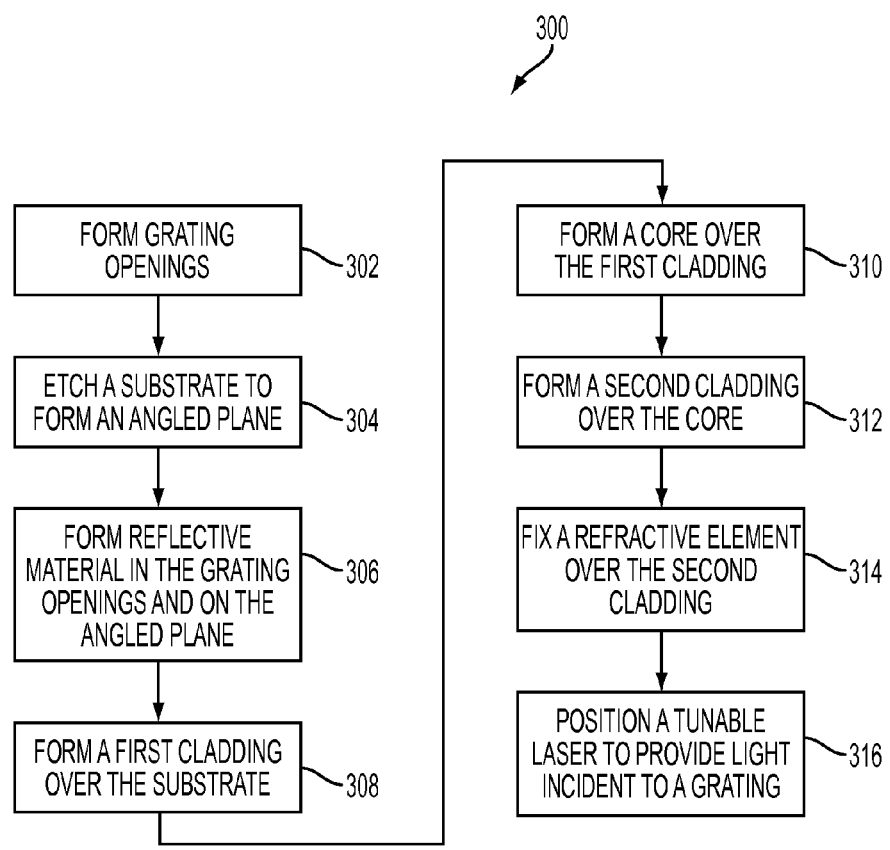
FIG. 3 is a flow chart of a method of making an optical scanner in accordance with one or more embodiments.

FIG. 3 is a flow chart of a method 300 of making an optical scanner in accordance with one or more embodiments. Method 300 begins with operation 302 in which grating openings are formed. In some embodiments, the grating openings are formed in a substrate, e.g., substrate 102 (FIG. 1), using a photolithography/etching processes. In some embodiments, the substrate is etched using a plasma etching process. The plasma etching process helps to form sidewalls for the grating openings substantially perpendicular to a top surface of the substrate. In some embodiments, an angle between a normal of the top surface of the substrate and the sidewalls of the grating openings is less than about 5-degrees. The substantially perpendicular sidewalls of the grating openings help to control the diffraction angle of a grating formed using the grating openings.

In some embodiments, the grating openings are formed in an optical layer over a top surface of the substrate. In some embodiments, the optical layer comprises $SiO_2$ or another suitable optical material. In some embodiments, the grating openings are formed in the optical layer using a photolithography/etching processes. In some embodiments, the optical layer is etched using a plasma etching process. In some embodiments, an angle between a normal of the top surface of the substrate and the sidewalls of the grating openings is less than about 5-degrees.

In operation 304, the substrate is etched to form an angled plane. In some embodiments, the angled plane is formed in a substrate using a photolithography/etching processes. In some embodiments, the substrate is etched using a wet etching process. In some embodiments, the angled plane is formed by using an etchant which has a specific crystal selectivity. In some embodiments, the etchant includes potassium hydroxide (KOH), tetramethylammonium hydroxide (TMAH), or another suitable etchant. In some embodiments, an angle of between a surface of the angled plane and the top surface of the substrate ranges from about 35-degrees to about 60-degrees. In some embodiments, the angle between the surface of the angled pane and the top surface of the substrate is about 45-degrees.

A reflective material is formed in the grating openings and on the angled plane, in operation 306. The reflective material substantially fills the grating openings to form a grating, e.g., grating 110 (FIG. 1). The reflective material coats the angle plane to form an angled reflective surface, e.g., angled reflective surface 120. In some embodiments, the reflective material includes Al, Ti, W, Co, Cu, Au, Ag, or one or more other suitable reflective materials. In some embodiments, the reflective material is formed using electroplating, physical vapor deposition (PVD), sputtering, atomic layer deposition (ALD) or other suitable formation methods.

In some embodiments, operation 306 is separated into multiple formation operations. In some embodiments, the grating openings are filled separately from the coating of the angled plane. In some embodiments, a different reflective material is used to fill the grating openings in comparison with the reflective material used to coating the angled plane. In some embodiments, a same material is used to fill the grating openings and the angled plane, but the processes are performed separately. In some embodiments, the grating openings are filed prior to coating the angled plane. In some embodiments, the grating openings are filled after coating the angled plane.

In operation 308, a first cladding layer is formed over the substrate. In some embodiments, the first cladding layer, e.g., bottom cladding 108 (FIG. 2A), is formed using PVD, chemical vapor deposition (CVD), sputtering, spin-on coating or another suitable formation method. In some embodiments, the first cladding is formed to a thickness ranging from about 0.2 μm to about 10 μm. In some embodiments, the first cladding includes SiON, $SiO_2$, or another suitable material. In some embodiments, operation 308 is performed prior to operation 302 and the first cladding layer is the intermediate layer discussed above.

A core layer formed over the first cladding layer in operation 310. In some embodiments, the core layer, e.g., core 104 (FIG. 1), is formed using PVD, CVD, sputtering, spin-on coating or another suitable formation method. A refractive index of the core layer is higher than a refractive index of the first cladding layer. In some embodiments, a different in the refractive index of the core layer and the refractive index of the first cladding layer ranges from about 0.05 to about 1.0. A material of the core layer is selected to be transparent to a desire waveband of light. In some embodiments, the core layer includes polysilicon, a high-k dielectric material, or another suitable material. In some embodiments, the high-k dielectric material includes SiN, $Al_2O_3$, $HfO_2$, or other suitable high-k dielectric materials. In some embodiments, a thickness of the core layer ranges from about 1 micron (μm) to about 20 μm.

In operation 312, a second cladding layer is formed over the core layer. In some embodiments, the second cladding layer, e.g., top cladding 106 (FIG. 1), is formed using PVD, CVD, sputtering, spin-on coating or another suitable formation method. In some embodiments, the formation method of the second cladding layer is the same as the formation method of the first cladding layer. In some embodiments, the formation method of the second cladding layer is different from the formation method of the first cladding layer. In some embodiments, the second cladding is formed to a thickness ranging from about 0.2 μm to about 10 μm. In some embodiments, the thickness of the second cladding layer is the same as the thickness of the first cladding layer. In some embodiments, the thickness of the second cladding layer is different from the thickness of the first cladding layer. In some embodiments, the second cladding includes SiON, $SiO_2$, or another suitable material. In some embodiments, the material of the second cladding layer is the same as the material of the first cladding layer. In some embodiments, the material of the second cladding layer is different from the material of the first cladding layer.

A refractive element is fixed over the second cladding layer in operation 314. The refractive element, e.g., refractive element 130 (FIG. 1), is positioned to receive light reflected by the coated angled plane. In some embodiments, the refractive element is fixed over the second cladding layer by an optical adhesive. The optical adhesive is transparent to the desired waveband of light. In some embodiments, the refractive element is fixed directed to the second cladding layer. In some embodiments, the refractive element is fixed to an intermediate layer which is disposed over the second cladding layer. The refractive element focuses light in a first direction and diverges light in a second direction perpendicular to the first direction.

In operation 316, a tunable laser is positioned to provide light incident to a grating. The grating is formed by filling the grating openings in operation 306. The light from the tunable laser, e.g., tunable laser 140 (FIG. 1), is provided to the grating through the core layer. The tunable laser is disposed on a same optical bench as the grating. In some embodiments, the tunable laser is at least partially disposed within the core layer. In some embodiments, the tunable layer is disposed completely outside the core layer. A wavelength of light emitted by the tunable laser is adjustable. In some embodiments, a width of a waveband of the light emitting by the tunable laser ranges from about 40 nm to about 75 nm. In some embodiments, a center wavelength of the tunable laser ranges from about 400 nm to about 2,000 nm. In some embodiments, a sweeping frequency of the tunable laser ranges from about 100 kilohertz (kHz) to about 100 megahertz (MHz).

One of ordinary skill in the art would recognize that additional operations are able to be added to method 300 without departing from the scope of this description. One of ordinary skill in the art would also recognize that an order of the operations described with respect to method 300 is able to be adjusted.

Figure 4:
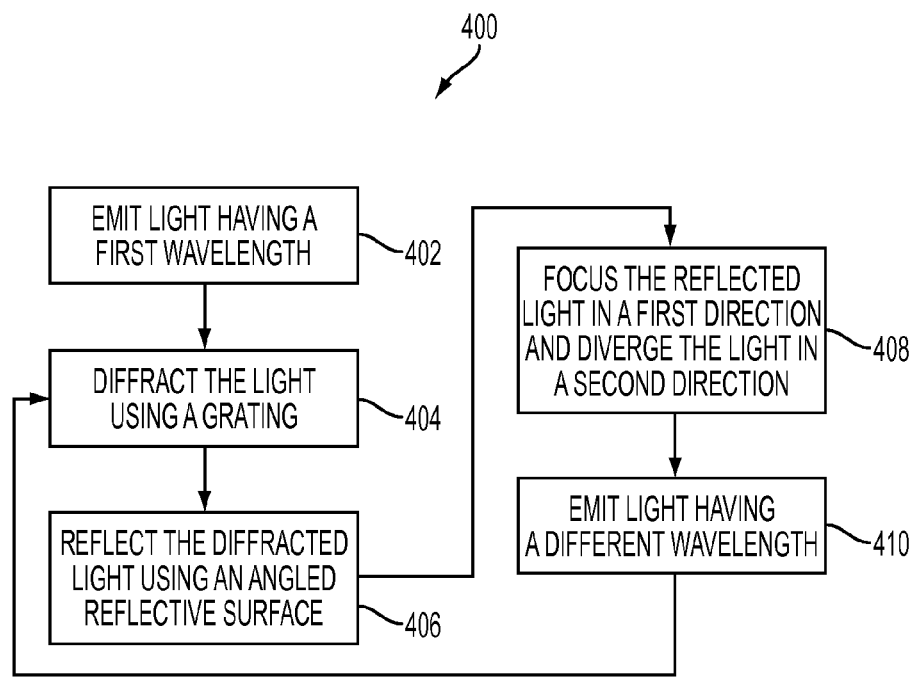
FIG. 4 is a flow chart of a method of using an optical scanner in accordance with one or more embodiments.

FIG. 4 is a flow chart of a method 400 of using an optical scanner in accordance with one or more embodiments. In operation 402, a light having a first wavelength is emitted by a tunable laser. In some embodiments, the tunable laser, e.g., tunable laser 140 (FIG. 1), emits the light having the first wavelength ranging from about 325 nm to about 2,075 nm. A core, e.g., core 104, receives the light emitted by the tunable laser. In some embodiments, the light is emitted directly into the core. In some embodiments, the light emitted outside the core within a cone of acceptance of the core.

In operation 404, the light is diffracted using a grating. The grating, e.g., grating 110 (FIG. 1), receives the emitted light which propagates through the core. The grating is a reflective grating. An angle of diffraction of the grating is determined based on a wavelength of the light being diffracted. In some embodiments, the grating is concave to help control a direction of the diffracted light.

The diffracted light is reflected using an angled reflective surface in operation 406. The angled reflective surface, e.g., angled reflective surface 120 (FIG. 1), receives the diffracted light from the grating through the core. The angled reflective surface reflects the light out of the core.

In operation 408, the reflected light is focused in a first direction and diverged in a second direction. The second direction is perpendicular to the first direction. A refractive element, e.g., refractive element 130 (FIG. 1), is used to focus the light in the first direction and diverge the light in the second direction. By focusing the light in the first direction and diverging the light in the second direction, a line of light is formed.

A different wavelength of light is emitted in operation 410. The wavelength of light is changed using the tunable laser. In some embodiments, the tunable laser sweeps across wavelengths at a frequency ranging from about 100 kHz to about 100 MHz.

Method 400 then returns to operation 404. The angle of diffraction for the light will be different from the light having the first wavelength. As a result, the diffracted light will contact the angled reflective surface at a different location from the light having the first wavelength. Thus, a line formed in operation 408 has a different location due to the different wavelength of the light emitted from the tunable laser. As the tunable laser sweeps through the waveband of light, the line produced in operation 408 will sweep across an object being scanned.

One of ordinary skill in the art would recognize that additional operations are able to be added to method 400 without departing from the scope of this description. One of ordinary skill in the art would also recognize that an order of the operations described with respect to method 400 is able to be adjusted.

One aspect of this description relates to an optical scanner. The optical scanner includes a substrate, and a tunable laser on the substrate, wherein the tunable laser is configured to emit light, and to sweep a wavelength of the emitted light through a waveband. The optical scanner further includes a grating over a top surface of the substrate, the grating configured to diffract light emitted from the tunable laser, and an angled reflective surface configured to reflect the diffracted light from the grating. The optical scanner further includes a refractive element configured to receive the reflected light from the angled reflective surface. The refractive element is configured to focus the reflected light in a first direction and to diverge the reflected light in a second direction perpendicular to the first direction.

Another aspect of this description relates to a method of making an optical scanner. The method includes positioning a tunable laser on a substrate, wherein the tunable laser is configured to emit light, and to sweep a wavelength of the emitted light through a waveband. The method further includes forming a grating on the substrate at a position to receive light emitted from the tunable laser, and forming an angled reflective surface on the substrate at a position to receive light diffracted by the grating. The method further includes fixing a refractive element over the substrate at a position to receive light reflected by the angled reflective surface, wherein the refractive element is configured to focus the reflected light in a first direction and to diverge the reflected light in a second direction perpendicular to the first direction.

Still another aspect of this description relates to a method of using an optical scanner. The method includes guiding light using a tunable laser disposed on a substrate, diffracting the emitted light using a grating over a top surface of the substrate, and reflecting the diffracted light using an angled reflective surface over the top surface of the substrate. The method further includes focusing the reflected light in a first direction and diverging the reflected light in a second direction perpendicular to the first direction, using a refractive element. The method further includes sweeping a wavelength of the light through a waveband using the tunable laser.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An optical scanner comprising:
    a substrate;
    a tunable laser on the substrate, wherein the tunable laser is configured to emit light, and to sweep a wavelength of the emitted light through a waveband;
    a grating over a top surface of the substrate, the grating configured to diffract light emitted from the tunable laser;
    an angled reflective surface configured to reflect the diffracted light from the grating; and
    a refractive element configured to receive the reflected light from the angled reflective surface, wherein the refractive element is configured to focus the reflected light in a first direction and to diverge the reflected light in a second direction perpendicular to the first direction.

2. The optical scanner of claim 1, further comprising:
    a core over the substrate, wherein at least a portion of the core is between the tunable laser and the grating;
    a bottom cladding between the core and the substrate; and
    a top cladding over the core.

3. The optical scanner of claim 2, wherein a refractive index of the core is greater than a refractive index of the bottom cladding, and the refractive index of the core is greater than a refractive index of the top cladding.

4. The optical scanner of claim 2, wherein the top cladding is between the angled reflective surface and the refractive element.

5. The optical scanner of claim 2, wherein a difference between a refractive index of the core and a refractive index of the bottom cladding ranges from about 0.05 to about 1.0, and a difference between the refractive index of the core and a refractive index of the top cladding ranges from about 0.05 to about 1.0.

6. The optical scanner of claim 2, wherein the bottom cladding is between the grating and the substrate.

7. The optical scanner of claim 2, wherein the bottom cladding is between the angled reflective surface and the substrate.

8. The optical scanner of claim 1, wherein the tunable laser is configured to sweep the wavelength of the emitted light at a frequency ranging from about 100 kilohertz (kHz) to about 100 megahertz (MHz).

9. The optical scanner of claim 1, wherein the tunable laser is configured to sweep the wavelength over a wavelength range ranging from about 40 nanometers (nm) to about 75 nm.

10. The optical scanner of claim 1, wherein the grating is a concave reflective grating.

11. The optical scanner of claim 1, wherein the grating comprises a plurality of reflective elements, at least one reflective element of the plurality of reflective elements having sidewalls and an angle between the sidewalls and the top surface of the substrate ranges from about 85-degrees to about 95-degrees.

12. The optical scanner of claim 1, wherein the grating comprises a plurality of reflective elements, and at least one reflective element of the plurality of reflective elements comprises a same material as the angled reflective surface.

13. The optical scanner of claim 1, wherein the refractive element comprises a cylindrical lens.

14. A method of making an optical scanner, the method comprises:
    positioning a tunable laser on a substrate, wherein the tunable laser is configured to emit light, and to sweep a wavelength of the emitted light through a waveband;
    forming a grating on the substrate at a position to receive light emitted from the tunable laser;
    forming an angled reflective surface on the substrate at a position to receive light diffracted by the grating; and
    fixing a refractive element over the substrate at a position to receive light reflected by the angled reflective surface, wherein the refractive element is configured to focus the reflected light in a first direction and to diverge the reflected light in a second direction perpendicular to the first direction.

15. The method of claim 14, wherein forming the grating comprises:
    performing a plasma etch on the substrate to form a plurality of grating openings, wherein each grating opening of the plurality of grating openings has sidewalls, and an angle between a line normal to a top surface of the substrate and the sidewalls is less than about 5-degrees; and
    filling each grating opening of the plurality of grating openings with a reflective material.

16. The method of claim 14, further comprising:
    forming a core over the substrate, wherein at least a portion of the core is between the tunable laser and the grating;
    forming a bottom cladding between the core and the substrate; and
    forming a top cladding over the core.

17. The method of claim 16, wherein fixing the refractive element comprises fixing the refractive element to a top surface of the top cladding using an optical adhesive.

18. The method of claim 14, wherein forming the angled reflective surface comprises:
   wet etching the substrate to form an angled plane; and
   forming a reflective material over the angled plane.

19. A method of using an optical scanner, the method comprising:
   guiding light using a tunable laser disposed on a substrate;
   diffracting the emitted light using a grating over a top surface of the substrate;
   reflecting the diffracted light using an angled reflective surface over the top surface of the substrate;
   focusing the reflected light in a first direction and diverging the reflected light in a second direction perpendicular to the first direction, using a refractive element; and
   sweeping a wavelength of the light through a waveband using the tunable laser.

20. The method of claim 19, further comprising propagating the light through a core disposed between the tunable laser and the grating, and between the grating and the angled reflective surface, and wherein reflecting the diffracted light comprises reflecting the diffracted light through a top cladding disposed over the core.

* * * * *